United States Patent
Adachi et al.

(10) Patent No.: US 7,393,706 B2
(45) Date of Patent: Jul. 1, 2008

(54) METHOD OF MANUFACTURING OPTICAL SEMICONDUCTOR DEVICE, PACKAGE MOLDING JIG, METHOD OF MANUFACTURING PACKAGE MOLDING JIG AND MANUFACTURING APPARATUS FOR PACKAGE MOLDING JIG

(75) Inventors: Masaki Adachi, Yokohama (JP); Masaharu Yamanaka, Yokohama (JP); Fumihide Nagashima, Yokohama (JP); Tatsuhiko Nagafuchi, Kitakyushu (JP); Takao Abe, Yukuhashi (JP); Masayoshi Harada, Buzen (JP); Hirofumi Hansei, Buzen (JP); Hironari Kotsubo, Buzen (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 286 days.

(21) Appl. No.: 11/072,233

(22) Filed: Mar. 7, 2005

(65) Prior Publication Data
US 2005/0208690 A1    Sep. 22, 2005

(30) Foreign Application Priority Data
Mar. 18, 2004    (JP)    ............................. 2004-078316

(51) Int. Cl.
*H01L 21/00*    (2006.01)

(52) U.S. Cl. ........................................................ 438/26
(58) Field of Classification Search .................... 438/26
See application file for complete search history.

(56) References Cited

U.S. PATENT DOCUMENTS

| | | | | |
|---|---|---|---|---|
| 3,283,045 A | * | 11/1966 | Thiel ........................... | 264/549 |
| 3,764,862 A | * | 10/1973 | Jankowski ................... | 257/98 |
| 2006/0151924 A1 | * | 7/2006 | Iwasaki et al. .............. | 264/544 |

FOREIGN PATENT DOCUMENTS

| JP | 7-183440 | | 7/1995 |
|---|---|---|---|
| JP | 07183440 A | * | 7/1995 |
| JP | 2003266530 A | * | 9/2003 |

* cited by examiner

*Primary Examiner*—Lex Malsawma
(74) *Attorney, Agent, or Firm*—Oblon, Spivak, McClelland, Maier & Neustadt, P.C.

(57) ABSTRACT

A method of manufacturing an optical semiconductor device includes preparing an optical semiconductor provided on a distal end of a first lead portion of a lead frame and connected electrically with a distal end of a second lead portion of the lead frame, forming thermoplastic resin for preparing a package molding jig having a concave portion corresponding to a contour of a package of the optical semiconductor device, inserting the distal ends of the lead portions into the concave portion of the package molding jig for positioning and fixing, and filling packaging resin in the concave portion of the package molding jig.

19 Claims, 9 Drawing Sheets

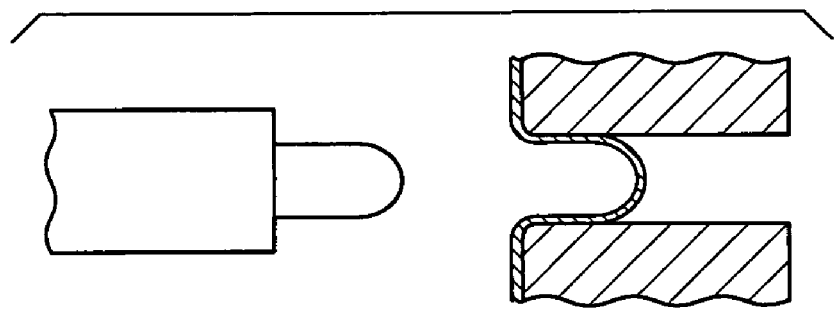
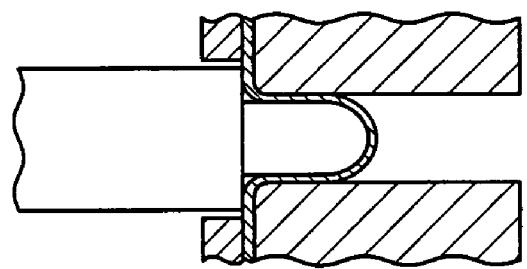
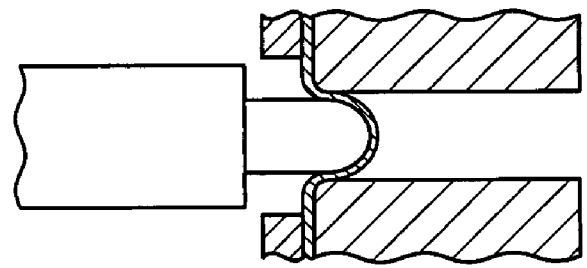
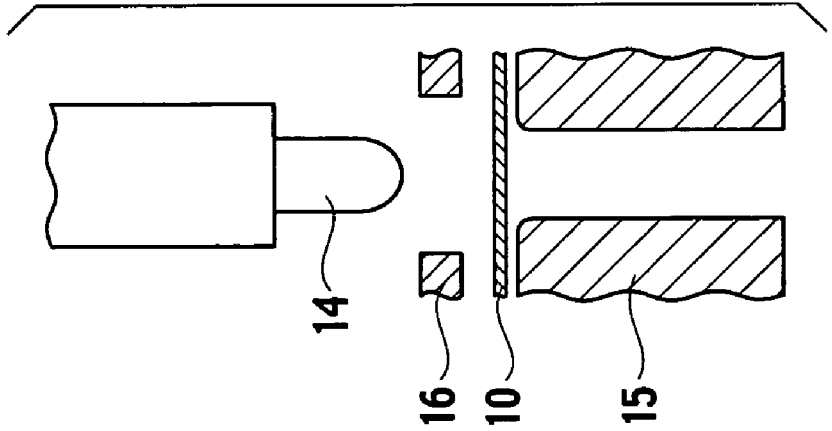

METHOD OF MANUFACTURING OPTICAL SEMICONDUCTOR DEVICE, PACKAGE MOLDING JIG, METHOD OF MANUFACTURING PACKAGE MOLDING JIG AND MANUFACTURING APPARATUS FOR PACKAGE MOLDING JIG

CROSS REFERENCE TO RELATED APPLICATIONS

This application is based upon and claims the benefit of priority from prior Japanese Patent Application P2004-78316 filed on Mar. 18, 2004; the entire contents of which are incorporated by reference herein.

BACKGROUND OF THE INVENTION

1. Field of the Invention

The present invention relates to a package molding jig, a method of manufacturing the package molding jig and a manufacturing apparatus for the package molding jig for use in a method of manufacturing an optical semiconductor device and in fabrication of the optical semiconductor device.

2. Description of the Related Art

In the related art, attempts have been undertaken to provide packages for optical semiconductor devices, such as LEDs, formed by casting or transfer molding using thermoplastic resin composed of main component such as epoxy resin.

Among such optical semiconductor devices, it has been a usual practice for round (shell-shaped) type LED lamps, for use in various applications such as information display plates and stop lamps of automotive vehicles, to be manufactured such that an optical semiconductor element (light-emitting element) is connected to and secured onto a distal end of a lead portion of a lead frame upon which the light-emitting element and a distal end of an adjacent lead portion are electrically connected by wire bonding upon which epoxy resin with a translucency is filled by casting for thereby forming a package in a given shape. This casting is a method of forming a lens portion with the use of a die made of resin and suited for manufacturing the round type LED lamps in a wide variety of lens shapes.

A die used for casting such epoxy resin, that is, a package molding jig, is generally manufactured by injection molding in a process separate from a manufacturing process of the above-described semiconductor device using polymethylpentene (Trademark: TPX) among thermoplastic resins.

Further, the casting of epoxy resin with the use of the package molding jig is carried out after the light-emitting element is connected by wire bonding upon which epoxy resin is filled in the package molding jig and a distal end, mounted with the light-emitting element, of the lead frame is immersed in the package molding jig in a given depth. Subsequently, in order to harden epoxy resin, the package molding jig is placed in a high temperature curing furnace at temperatures of 100 to 140° C. and heat is applied to the package molding jig for hardening.

After epoxy resin has been hardened, the package molding jig is removed from the lead frame subsequent to package molding, obtaining a round type LED lamp with a given shape. Subsequently, the lead frame is processed in a given shape and subjected to electrical tests and products accepted in tests are packaged for delivery.

Further, the package molding jig, for use in package molding implemented by above-described casting method, is repeatedly used for 20 to 30 times, which vary depending on the lens shapes to be subjected to casting, and then discarded.

Such a related art casting jig is disclosed in, for instance, Japanese Patent Provisional Publication No. 7-183440.

As mentioned above, during casting in the manufacturing process of the related art round type LED lamp, use is made of the package molding jig that is manufactured by injection molding thermoplastic resin as raw material. Since the package molding jig plays a role as a molding die for a lens shape of the round type LED lamp and the round type LED lamps to be manufactured have great variety of lens shapes, there is a need for package molding jigs to be prepared in conformity with the lens shapes of the round type LED lamps to be manufactured. Accordingly, in order to fabricate such package molding jigs by injection molding, a large number of injection molding dies conformed to the lens shapes must be manufactured with the resultant increase in labor hours and expenses in the fabrication. Also, a space is required for storage of such injection molding dies.

Further, the manufactured package molding jigs result in an increase in costs because of increased costs in fabrication and, hence, when manufacturing the round type LED lamps in view of cost reduction, one package molding jig needs to be used for 20 to 30 times. Therefore, it is required for reserving a place for storage of the large number of package molding jigs depending on the lens shapes of the round type LED lamps to be manufactured. In addition to this, since polymethylpentene, conventionally used in the package molding jig as raw material, is crystalline resin, contraction occurs due to crystallization each time a thermal history is applied, resulting in variation in dimensional precision. Therefore, the dimensional precision of the package molding jig differs in value at the first time when the package molding jig is used for manufacturing the round type LED lamp and at twentieth time when the package molding jig is used for manufacturing the round type LED lamp. Thus, variations occur in the lens shape of the manufactured round type LED lamp and the position of the light-emitting element in the round type LED lamp, causing the occurrence of fears in a difficulty of maintaining a product quality in a stable fashion.

In addition, during the related art round type LED lamp manufacturing process, the casting is carried out and a curing process (hardening process) is implemented to allow epoxy resin (sealing resin), which serves as a package, to be hardened upon which the package molding jig is removed and, thereafter, the lead frame is subjected to post-processes such as processing step and inspection step. During such post-processes or during handling operations subsequent to the post-processes, there are probabilities wherein lens portions of products are carelessly damaged, causing the occurrence of defective products.

SUMMARY OF THE INVENTION

An aspect of the present invention inheres in a method of manufacturing an optical semiconductor device, which includes preparing an optical semiconductor provided on a distal end of a first lead portion of a lead frame and connected electrically with a distal end of a second lead portion of the lead frame, deep-draw forming thermoplastic resin for preparing a package molding jig having a concave portion corresponding to a contour of a package of the optical semiconductor device, inserting the distal ends of the lead portions into the concave portion of the package molding jig for positioning and fixing, and filling packaging resin in the concave portion of the package molding jig.

Another aspect of the present invention inheres in a package molding jig for an optical semiconductor device, which includes thermoplastic resin deep-draw formed using a punch corresponding to a contour of a package of the optical semiconductor device for thereby forming a concave portion corresponding to the contour of the package.

Still another aspect of the present invention inheres in a method of manufacturing a package molding jig of an optical semiconductor device, which includes preparing thermoplastic resin, and deep-draw forming the thermoplastic resin using a punch with a shape corresponding to a contour of a package of the optical semiconductor device for thereby forming a concave portion corresponding to the contour of the package.

Still another aspect of the present invention inheres in a manufacturing apparatus for a package molding jig of an optical semiconductor device, which includes a heater heating thermoplastic resin, a punch having a shape corresponding to a contour of a package of the optical semiconductor device, and a die to which the punch is inserted while deep-draw forming the thermoplastic resin.

BRIEF DESCRIPTION OF THE DRAWINGS

FIGS. 8A to 8D are cross-sectional views for illustrating deep-draw forming operations.

DETAILED DESCRIPTION OF EMBODIMENTS

Figure 1:
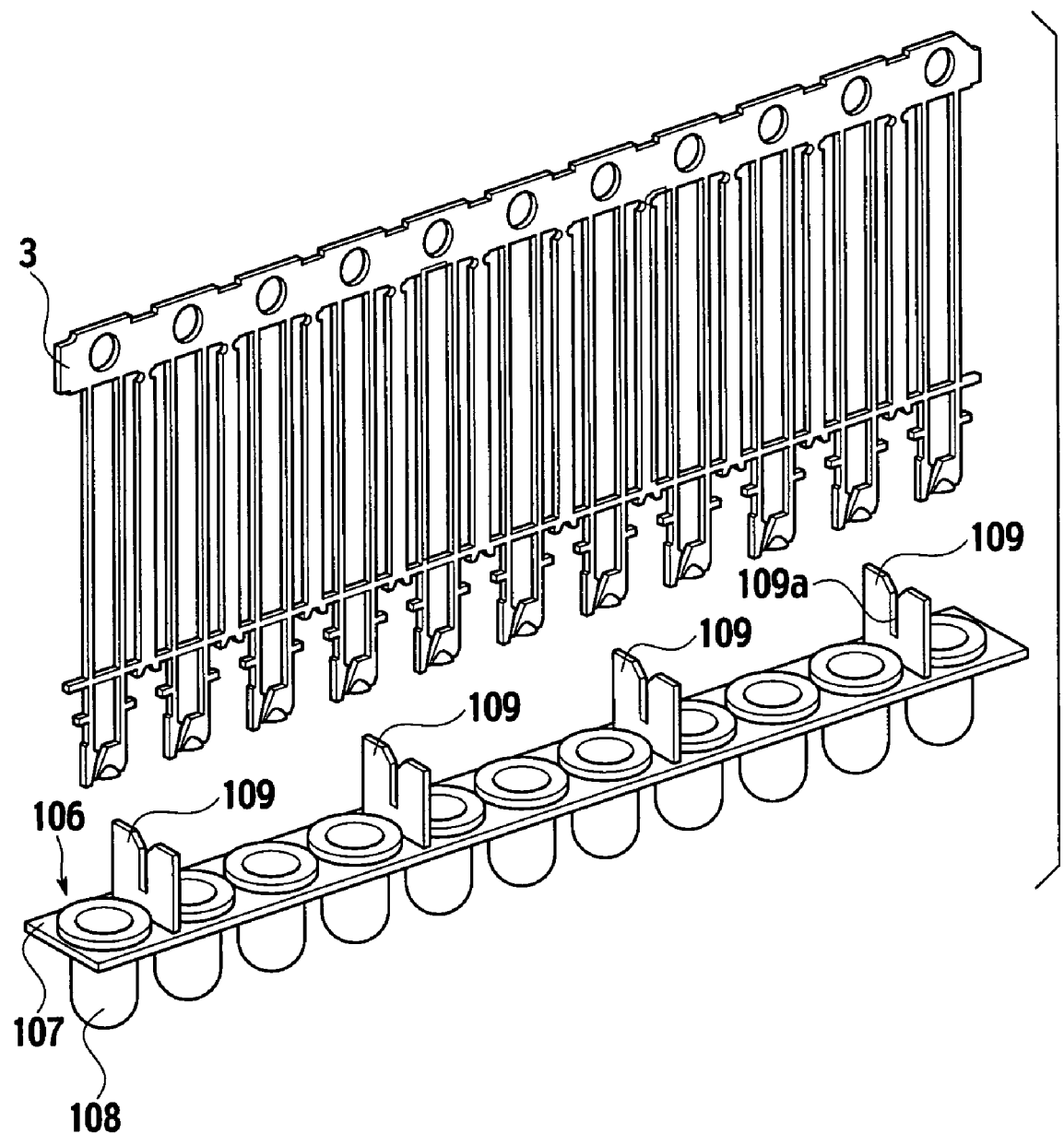
FIG. 1 is a perspective view of a package molding jig of the related art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following description specific details are set forth, such as specific materials, process and equipment in order to provide thorough understanding of the present invention. It will be apparent, however, to one skilled in the art that the present invention may be practiced without these specific details. In other instances, well-known manufacturing materials, process and equipment are not set forth in detail in order not unnecessary obscure the present invention.

Figure 3:
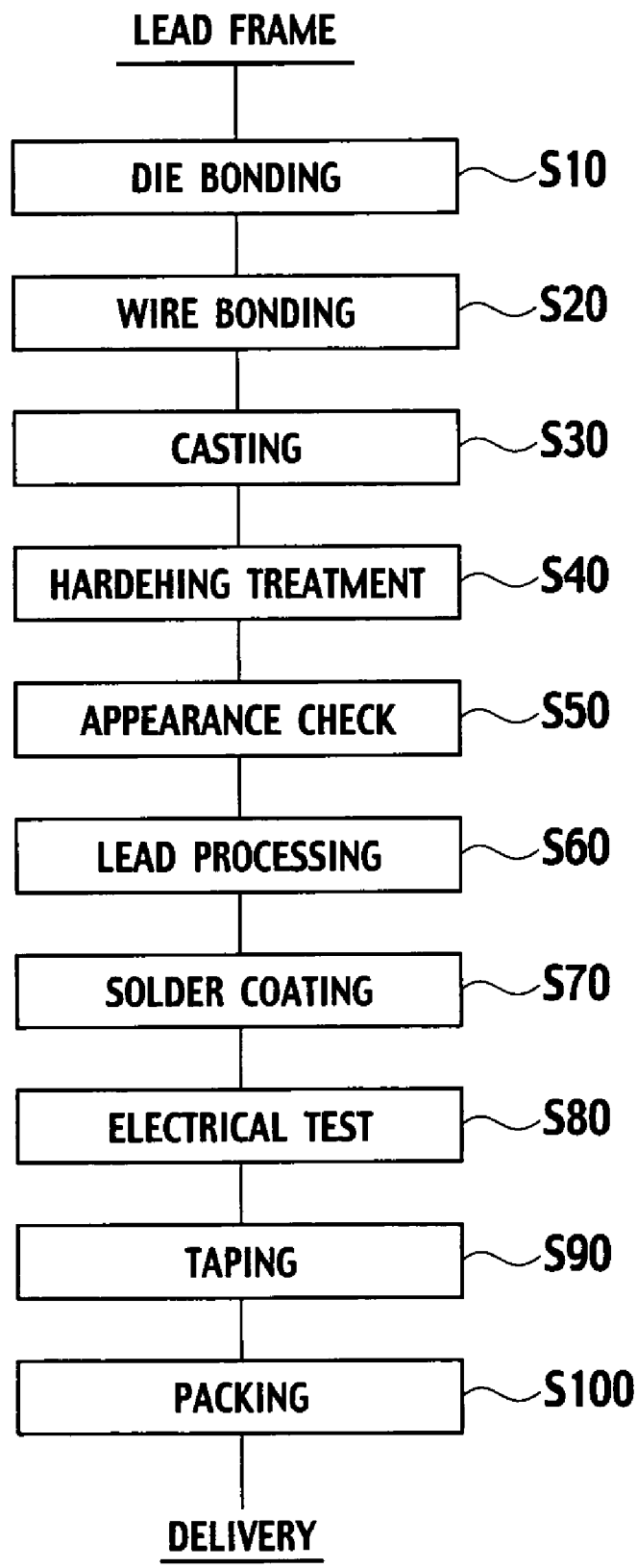
FIG. 3 is a block diagram showing manufacturing steps of a round type LED lamp to which a manufacturing method of the present invention is applied.

FIG. 3 shows an example of a flowchart of manufacturing steps in a case where a method of manufacturing a semiconductor manufacturing apparatus according to the present invention is applied to the manufacturing of a round-type LED lamp. First, die bonding is carried on a lead frame. That is, conductive paste is coated on a distal end of a lead portion of the lead frame, on which a chip of a light-emitting element is located and fixedly secured to the lead frame, upon which a rear surface electrode of the chip and the lead frame are electrically connected (S10 in FIG. 3: ditto). Next, wire bonding is carried out. That is, an electrode on a chip surface of the light-emitting element and a distal end of the other lead portion adjacent to the lead portion on which the light-emitting element is mounted are electrically connected by a bonding wire, made of a gold thin wire, (S20). Thereafter, the distal ends of the adjacent lead portions, which are connected by wire bonding, are sealed with transparent epoxy resin using a casting method (hereinafter also referred to as "casting") (S30). After casting, the lead frame is left in a heating furnace for about one hour under an atmosphere at temperatures of approximately 100 to 140° C., thereby hardening epoxy resin (S40). After hardening treatment, appearance check (S50) and lead processing (S60) are conducted and the leads are covered with solder (S70), upon which electrical testing is conducted (S80) and an accepted product is taped and packed (S90 and S100) for delivery.

Figure 4:
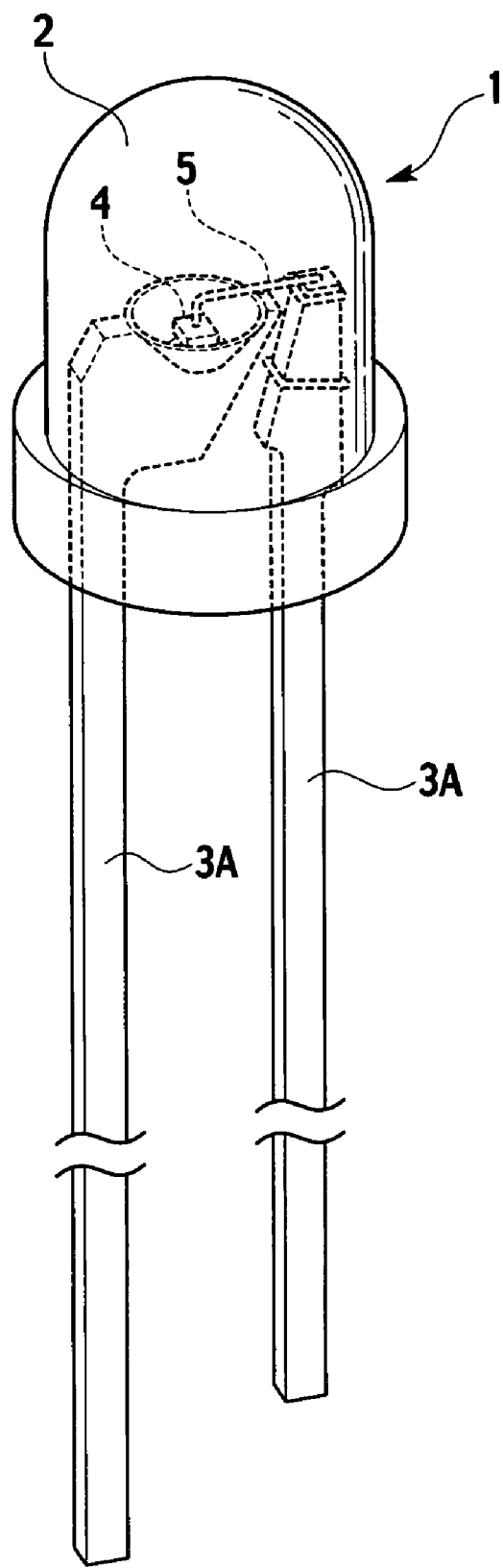
FIG. 4 is a perspective view of the round type LED lamp.

FIG. 4 typically shows a round type LED lamp manufactured through the implementation of such steps. The round type LED lamp 1 includes two leads 3A whose distal ends are placed in an inside of a sealing resin 2, made of transparent epoxy resin, with a given distance and sealed therein in a package. One distal end of the lead 3A is formed in a dish shape that has a distal end portion to which the light-emitting element 4 is die bonded. Then, wire bonding is carried out using a bonding wire 5 to electrically connect the light-emitting element 4 and the distal end of the lead 3A to each other. With such a round type LED lamp 1, since the sealing resin 2, formed of transparent epoxy resin, has an outer shape that plays a role as a lens for a light emitted from the light-emitting element, it is required for the package, formed of resin, to be fabricated in a high precision. Also, it is needless to say that the LED lamp 1 needs to be fabricated without causing any damage to a contour of the sealing resin 2.

Figure 5:
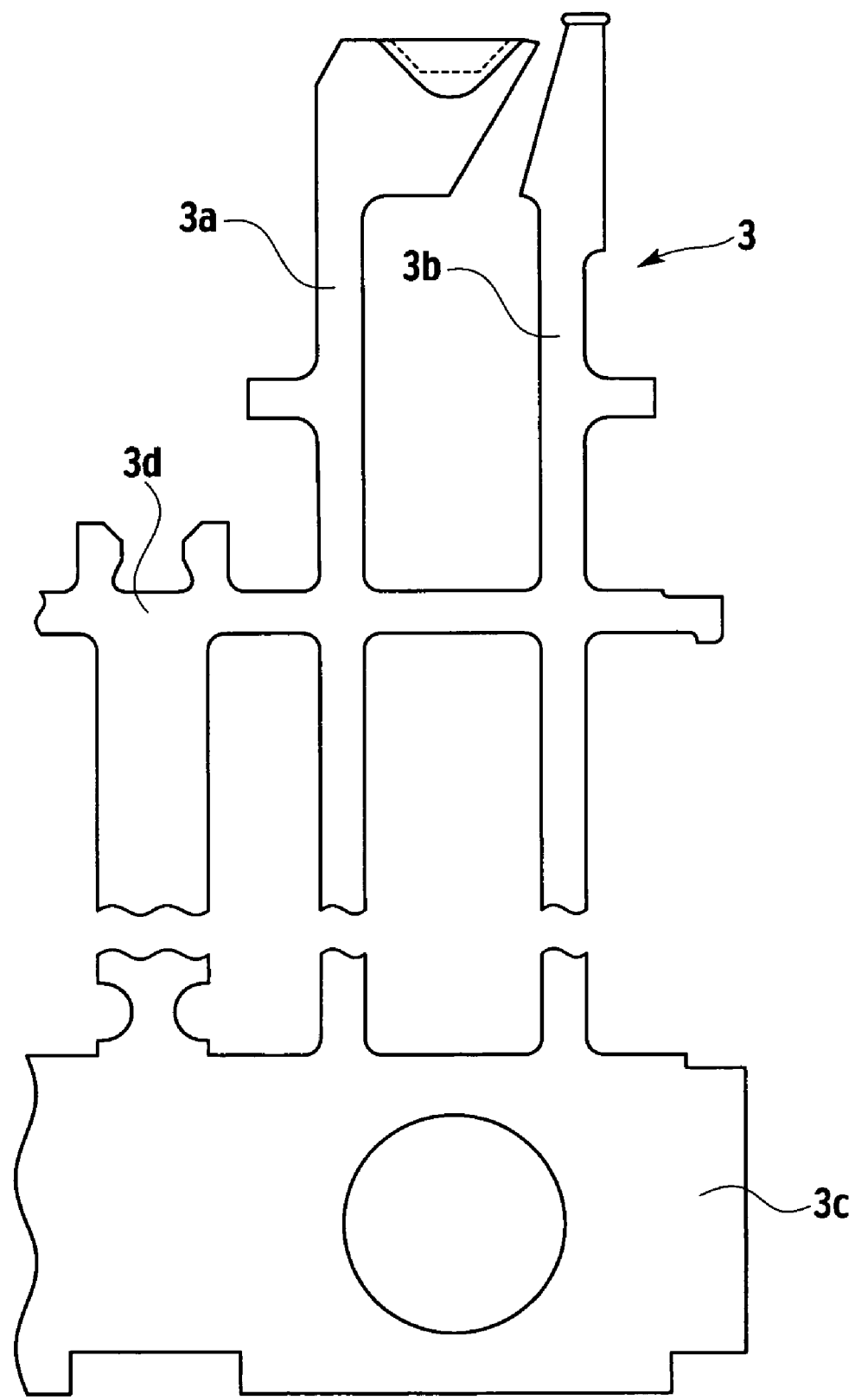
FIG. 5 is a plan view of an essential part of the lead frame.

FIG. 5 is a plan view of an essential part of one example of the lead frame used for manufacturing such a round type LED lamp. A lead frame 3 is comprised of a lead portion 3a, whose distal end is formed in a dish shape on which the light-emitting element 4 is mounted, and a lead portion 3b placed adjacent to the lead portion 3a and electrically connected to the light-emitting element 4 by the bonding wire 5. The plural lead portions, composed of the lead portions 3a, 3b in a pair, are juxtaposed and have root portions integrally formed with a frame portion 3c. Further, formed between one pair of the lead portions and the other pair of lead portions is a guide portion 3d that is adapted to be brought into abutment with an associated frame support segment that will be described below.

With such a structure, the light-emitting element 4 is connected to and fixed to the distal end of the lead portion 3a of the lead frame 3, upon which wire bonding is carried out to electrically connect the light-emitting element 4 and the distal end of the adjacent lead portion 3b, and, subsequently, casting is conducted on the lead frame 3. Description is made of a package molding jig for use in such casting.

FIG. 1 is a perspective view of a package molding jig of the related art. The package molding jig 106 is comprised of a thin plate 107, made of metal, which is formed with a plurality of apertures, and die bodies 108 formed in the apertures of the thin plate 107, respectively. The die bodies 108 are made of thermoplastic resin and formed by injection molding, especially, insert molding in convex configurations corresponding to contours of the sealing resins of the round type LED lamps to be manufactured, respectively. Further, a plurality of frame support segments 109 extend upright from the thin plate 107. Each support segment 109 has a central area formed with a vertically extending recess 109a that has the substantially same thickness as that of the lead frame 3. The support segments 109 pinch the lead frame 3 by means of the recesses 109a thereof and bottom walls of the recesses 109a are brought into abutment with the guide portions 3d for thereby supporting the lead frame 3.

Figure 2:
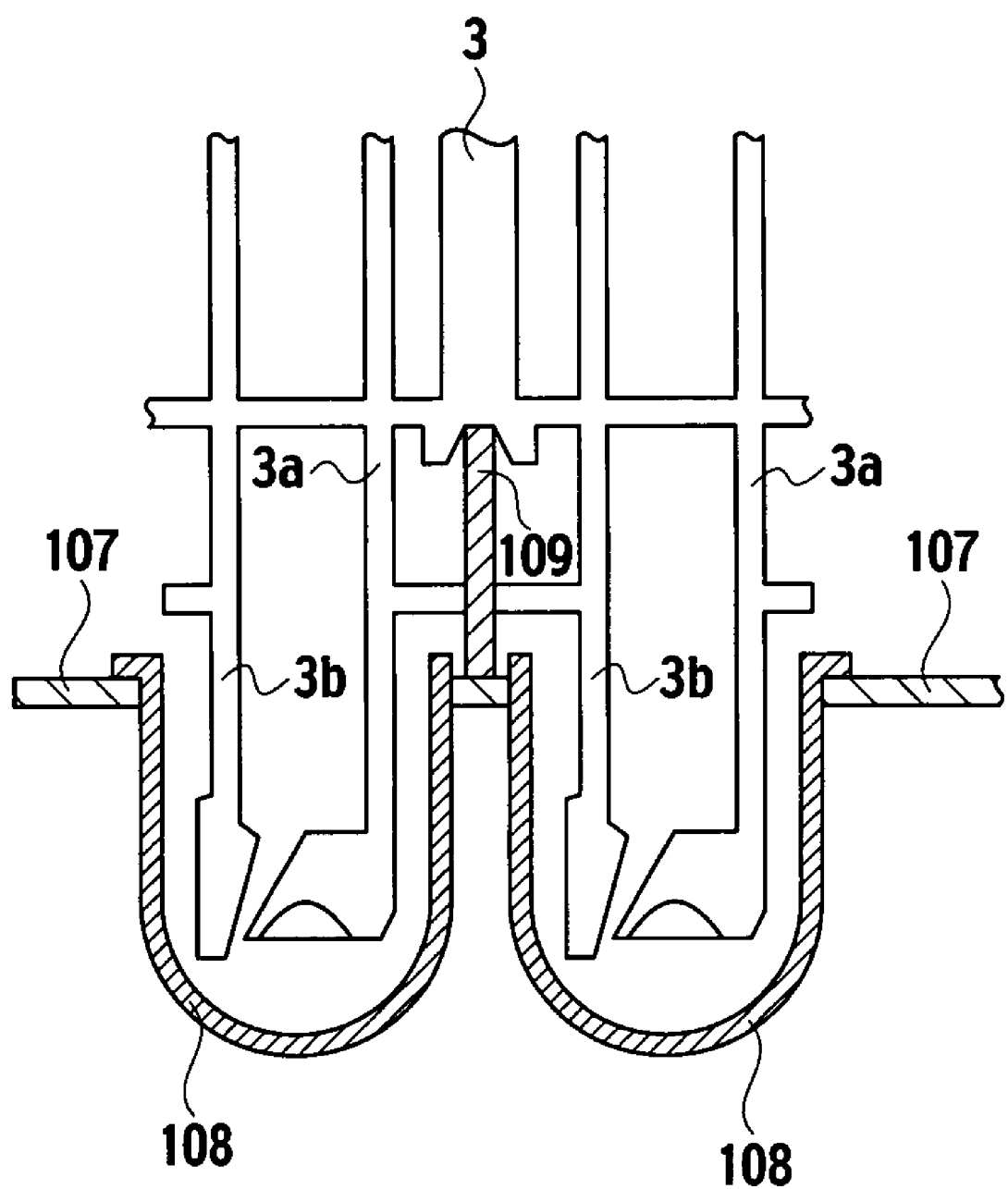
FIG. 2 is a view for illustrating how the related art package molding jig and a lead frame are positioned and fixed in place.

In order to execute the casting through the use of such a related art package molding jig 106, the concave portions of the respective die bodies 108 of the package molding jig 106 are filled with transparent epoxy resin for casting, while the lead frame 3, in which the light-emitting element 4 and the bonding wire are mounted, is brought into engagement with the frame support segments 109 of the package molding jig 106. Such an engaging condition is shown in FIG. 2 in a cross-sectional view of essential component parts. The lead frame 3 is positioned in and fixed in place under a condition where the guide portion 3d of the lead frame 3 is held in abutment with the bottom wall of the recess of the frame support segment 109 and the distal ends of the lead portions 3a, 3b are inserted to insides of the convex portions of the die bodies 108.

However, in cases where the casting is carried out using such a related art package molding jig, since the die bodies 108 of the package molding jig 106 are formed by injection molding, a large number of injection molding dies must be manufactured as already set forth above with the resultant increases in labor hour and cost for such manufacturing step. Further, an increased space is required for storage of such injection molding dies, additionally resulting in issues of storing the package molding dies, issues of enhancing qualities of products for repeated number of uses and issues of damages caused in subsequent steps.

Therefore, with the method of manufacturing the optical semiconductor device according to the present invention, a thermoplastic resin sheet is heated and thereafter deep drawing is conducted, thereby preparing a package molding jig with concave portions corresponding contours of respective packages. Then, the package molding jig manufactured by such deep drawing is used for manufacturing an optical semiconductor device.

Figure 6:
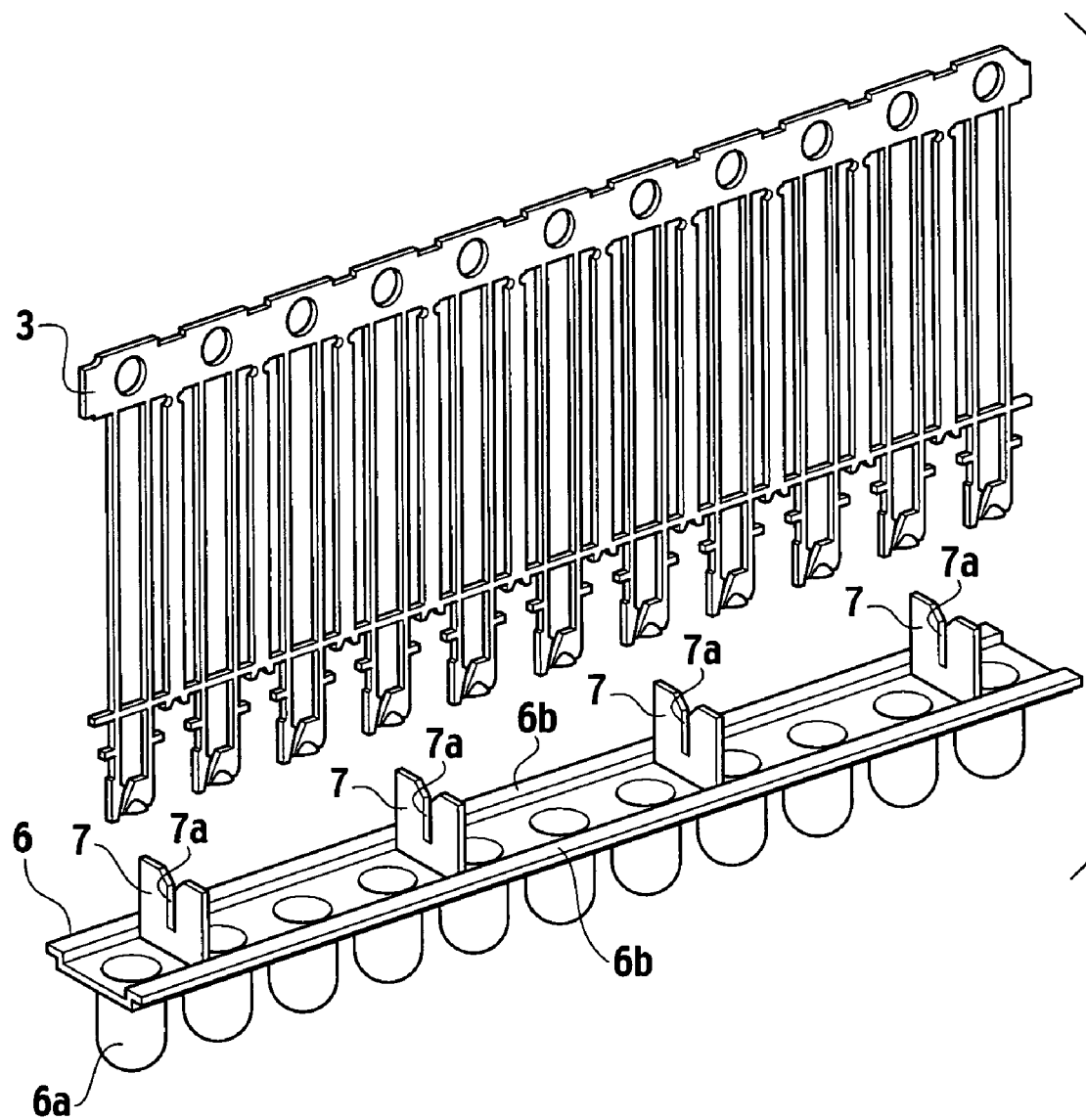
FIG. 6 is a perspective view of a package molding jig for use in the present invention.

One example of such a package molding jig for use in the present invention is shown in FIG. 6. The package molding jig 6 is made of raw material, such as a thermoplastic resin sheet, and formed by deep-draw forming using a punch with a profile corresponding to a contour of each package to form concave portions 6a that serve as molding dies for forming lens profiles of round type LED lamps. Also, the package molding jig 6 has side edges formed with ribs 6b, depending on needs, for the purpose of preventing change in shape of the package molding jig during handling thereof.

Further, in conducting the casting with the use of such a package molding jig 6, a plurality support segments 7, with the same shape and function as those of the frame support segments 109 provided on the related art package molding jig 6, are fixedly supported upright on the package molding jig 6 in a direct fashion or by means of reinforce plates to allow upwardly and vertically extending recesses 7a, formed in central areas of the respective frame support segments 7, to pinch and support the lead frame 3 under a condition where the guide portions 3d of the lead frame 3 are held in abutment with associated bottom walls of the respective recesses 7a, whereby the lead frame 3 can be supported in a fixed place.

Thus, the distal ends of the adjacent lead portions 3a, 3b, which are connected to each other by wire bonding as set forth above, are inserted to the concave portions 6a of the package molding jig 6a and the lead frame 3 is positioned and fixed in place, while filling packaging epoxy resin to the concave portions 6a upon which the casting is carried out. An order, in which the lead frame 3 is positioned and fixed in place with respect to the concave portions 6a of such a package molding jig 6 and epoxy resin is filled in the concave portions 6a, may be such that the distal ends of the lead portions 3a, 3b of the lead frame 3 are initially inserted to the associated concave portions 6a and, subsequently, epoxy resin is filled in the concave portions 6a to which the distal end of the lead portions 3a, 3b have been already inserted or, in contrast, epoxy resin is initially filled in the concave portions 6a and, subsequently, the distal ends of the lead portions 3a, 3b are inserted to the concave portions 6a that has been already filled with epoxy resin. Moreover, epoxy resin may be filled in the concave portions 6a while inserting the distal ends of the lead portions 3a, 3b thereto.

After casting, hardening process is conducted in the same way as that of the related art and, thereafter, various work is conducted for appearance inspection, lead processing, electrical tests, taping and packing.

As set forth above, with a method of manufacturing an optical semiconductor device according to the present invention, when carrying out the casting, the package molding jig 6, which is fabricated from the thermoplastic resin sheet by deep-draw forming, is used. The deep-draw formation needs no gigantic die assembly and injection molding machine as required in injection molding, and using relatively simple devices with a punch and dies enables the package molding jig to be formed under conditions where the package molding jig has a forming efficiency and a dimensional precision equivalent to those of the injection molding. In addition, with the deep-draw forming, changing only the punch and dies enables the round type LED lamps to have various outer profiles (lens shapes) in desired configurations. Accordingly, no need arises for using an injection molding die assembly with no need for fabricating and storing the injection molding die assembly, resulting in reduction in manufacturing and maintenance costs of a manufacturing device for the package molding jig. Therefore, the package molding jig to be fabricated can be manufactured in low costs. For this reason, the package molding jig 6 is not necessarily required to be repeatedly used in view of cost reduction but may be used one time only for casting. Accordingly, it becomes possible to avoid fluctuations in dimensional precision of the package molding jig 6 resulting from repeated use thereof and, consequently, fluctuations in quality of manufactured products, providing a capability of manufacturing semiconductor devices with high quality in a stable fashion.

Further, the package molding jig 6 can be leveraged as a protective cover for sealed resin surfaces after casting. That is, even after the hardening process, the package molding jig is not removed from the lead frame to allow post-processes, such as a step of processing the lead frame, a step of inspection and electrical tests, to be conducted upon which the taping is conducted on the lead frame and, subsequently, the package molding jig is removed from the lead frame. By so doing, during the post-processes or during handling operations in subsequent processes, it becomes possible to prevent lens portions of the products from improvident occurrence of damage.

The thermoplastic resin sheet, constituting raw material for the package molding jig for use in a method of manufacturing an optical semiconductor device according to the present invention, may include resin composed of at least one kind selected from polymethylpentene, polyphenilene sulfide, polycarbonate, polyether sulfon, polyetherimide, polysulfon and cycloolefin polymer.

Thermoplastic resin for such a sheet may preferably include resin with translucency such as transparent resin. This is because even after the casting is carried out, the light-emitting element can be viewed through the concave portion 6a, made of such transparent resin sheet, making it possible to carry out appearance inspection of the product in post-process under conditions where the package molding jig 6 remains fixed to the lead frame 6.

Further, the thermoplastic resin sheet for use in the package molding jig 6 of the present invention needs to have characteristics such as favorable deep-drawing capability (with increased breaking elongation), heat resistant property (with an increased Vicat softening point), which withstands temperatures of epoxy resin filled in the concave portions, and low surface tension that provides the ease of removing epoxy resin after hardening. Among the resin materials set forth above, polymethylpentene has an excellent translucency, a Vicat softening point of a value greater than 170° C. and a heat resistance greater than 140° C. needed for transparent epoxy resin to be hardened. Moreover, this resin has a low surface tension of 24 dyne/cm next to fluorine to make it simple to remove the lens portion of epoxy resin after hardening. In addition, among the thermoplastic resins, this resin has an extremely favorable drawing capability and has a breaking elongation as high as 200%. Consequently, polymethylpentene may be preferably used in the package molding jig.

The thermoplastic resin sheet may have a thickness: a thickness of approximately 0.3 to 0.9 mm prior to the deep-draw forming and a thickness of approximately 0.05 to 0.6 mm at the concave portion resulting from the deep-draw forming. If the thickness of the thermoplastic resin is made too thin, strength of the concave portion 6a of the package molding jig 6 is not sufficient and, so, a lower limit of the thickness of the thermoplastic resin sheet is determined in the light of enhancing strength of the concave portion 6a. On the other hand, as the thickness of the thermoplastic resin sheet increases, the strength of the concave portion 6a increases in a preferable extent. However, if the thermoplastic resin sheet has a thickness with strength needed for casting, no further increased strength is particularly needed. Also, if the thermoplastic resin sheet is too thick, there is a probability wherein an elongated thermoplastic resin sheet formed in a rolled shape suffers from core sets, resulting in adverse affects when carrying out deep-draw forming of raw material using such a thermoplastic resin sheet when conducting casting with the use of the manufactured package molding jig 6. Thus, an upper limit of the thickness of the thermoplastic resin sheet is determined in light of such factors.

The thermoplastic resin sheet may include a single sheet with a given thickness for deep-draw formation. In an alternative, the thermoplastic resin sheet may include a plurality of overlapped sheets, that is, a layer of a plurality of sheets, for deep-draw formation. For instance, the thermoplastic resin sheet may be used in a single sheet with a thickness of 0.5 mm or in a combination of four sheets each with a thickness of 0.15 mm. Thus, a plurality of thermoplastic resin sheets are overlapped to form a thermoplastic resin sheet in a given thickness to be provided for deep-draw formation, whereby using the thermoplastic resin sheet with a sufficient thickness as raw material enables the package molding jig to be manufactured without causing any issues with the above-described core sets.

Now, description is made of a method of manufacturing the package molding jig.

The thermoplastic resin sheet described above is used as raw material and heated to temperatures above a softening point of the thermoplastic resin. In cases where thermoplastic resin is formed of polymethylpentene, the softening point lies at temperatures of 200 to 220° C. After heating, using a punch with a configuration corresponding to a contour of a semiconductor device package to be manufactured allows the deep-draw formation of the thermoplastic resin sheet. This allows the formation of a concave portion corresponding to the contour of the package that serves as the package molding jig. After deep-draw forming has been conducted to form the concave portion, side edges of the package molding jig are formed with ribs, respectively, thereby obtaining the package molding jig.

Figure 7:
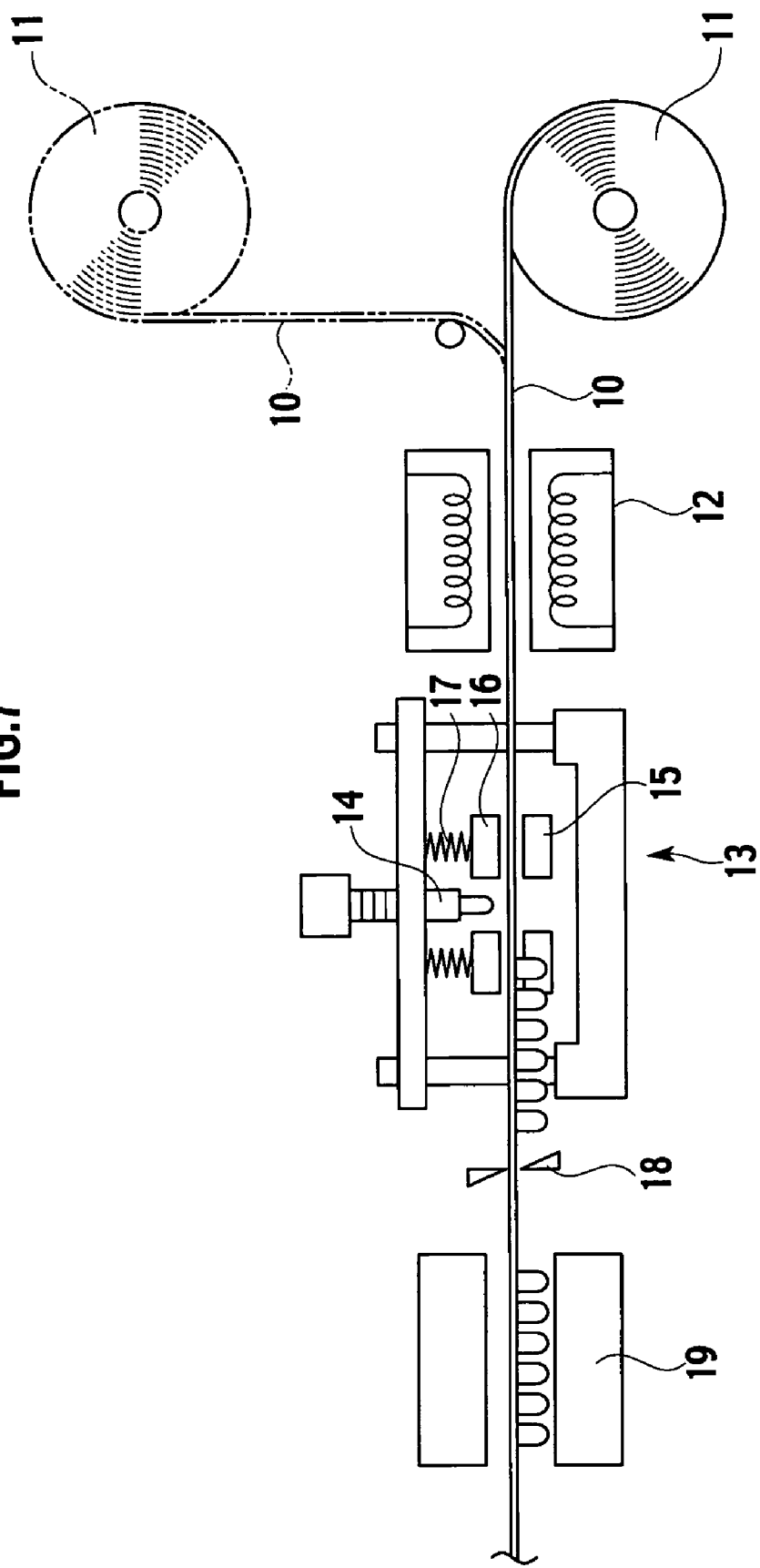
FIG. 7 is a typical view of a manufacturing apparatus for the package molding jig.

FIG. 7 typically shows one example of a manufacturing apparatus for use in fabrication of such a package molding jig. In the drawing figure, reference numeral 11 designates a coiler on which an elongated thermoplastic resin sheet is wound. The coiler may include a single unit or a plurality of units to allow a plurality of thermoplastic sheets to be supplied in an overlapped state. Disposed downstream of the coiler 11 is a heater 12 by which the thermoplastic resin sheet 10 is heated to a level above a softening point thereof.

Further, disposed adjacent to the heater 12 is a forming device 13 by which deep-draw forming is conducted on the heated thermoplastic resin sheet 10. The forming device 13 is comprised of a punch 14, which has a configuration corresponding to a contour of a semiconductor package to be manufactured, and a die 15, which is associated with the punch 14 to perform deep-draw forming, and takes the form of a structure wherein the punch 14 and the die 15 are disposed in upper and lower positions, respectively, so as to sandwich the thermoplastic resin sheet 10. Furthermore, disposed around the punch 14 are sheet holders 16 that are associated with springs 17. Also, although only one punch 14 is typically shown in FIG. 7, it is needless to say that an alternative may include a plurality of punches, which are placed side-by-side, such as, for example, in a 6 to 8-strand structure.

Disposed downstream of the forming device 13 is a cutter 18, by which the thermoplastic resin sheets 10 is cut in a given length of a package molding jig, and a crimping machine 19 that forms ribs on side edges of the thermoplastic resin sheet 10. Although the cutter 18 is located upstream of the crimping machine 19 in the illustrated example, the cutter 18 may be located downstream of the crimping machine 19. Using such a manufacturing apparatus enables the package molding jigs to be manufactured in a continuous fashion.

Now, deep-draw forming operations to be executed in the forming device 13 of the manufacturing apparatus shown in FIG. 7 are described with reference to FIG. 8. First, the thermoplastic resin sheet 10, which is heated by the heater 12 to the temperatures above the softening point, is continuously introduced to an area associated with the punch 14 and the die 15 of the forming device 13 (FIG. 8A). Prior to the deep-draw formation, the thermoplastic resin sheet 10 is held in non-contact with the punch 14 and the die 15. This is because a temperature drop in the thermoplastic resin sheet 10 beyond necessity due to contact with the punch 14 and the die 15 is prevented and temperature increases of the punch 14 and the die 15 beyond necessity are avoided. Next, the sheet holders 16 are moved downward to cause the sheet holders 16 and the punch 14 to pinch the thermoplastic resin sheet 10 with a given pressing force, upon which the punch 14 is moved downward (FIG. 8B). The punch 14 is pushed downward in a given depth to form a concave portion corresponding to the contour of the semiconductor package to be manufactured (FIG. 8C), whereupon the punch 14 is restored upward (FIG. 8D). Thereafter, the thermoplastic resin sheet 10, which is manufactured, is removed from the die 15 and then transferred to a downstream area. In such a way, the deep-draw formation can be conducted in a continuous fashion. Locating a plurality of punches in a juxtaposed relationship allows the deep-draw formation of a plurality of concave portions at one time, resulting in further improvement in manufacturing efficiency.

Figure 9:
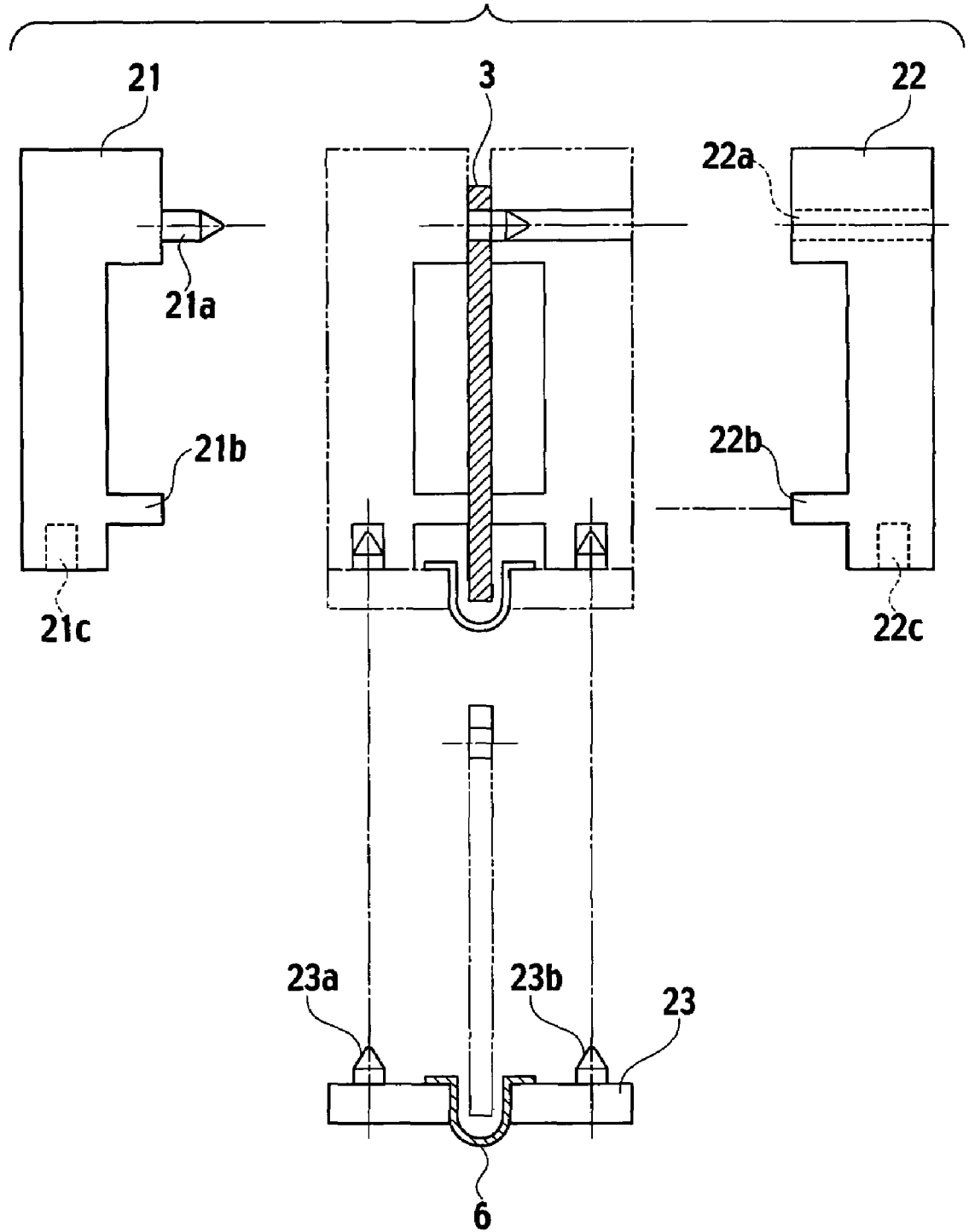
FIG. 9 is a view for illustrating other example of a positioning and fixing means.

In the foregoing, while the method of manufacturing the optical semiconductor device of the present invention and the method of manufacturing the package molding jig thereof and the device of the presently filed embodiment have been described with reference to FIGS. 3 to 8, it is needless to say that the method of manufacturing the optical semiconductor device of the present invention is not limited to the particular examples shown in FIGS. 3 to 8. For instance, the positioning and fixing between the lead frame 3 and the package molding jig 6 is not limited to an exemplary case employing the frame support segment 7 shown in FIG. 6. Other example of a positioning and fixing means is shown in FIG. 9. The positioning and fixing means shown in FIG. 9 is comprised of guide plates 21, 22, mounted in a way to pinch the lead frame 3 in a thickness direction thereof, and a support plate 23 on which the package molding jig is placed.

Disposed on a side face of the guide plate 21 at an upper area thereof is a positioning pin 21a, which is engageable with a positioning bore 22a formed in the guide plate 22. Also, formed on the side face of the guide plate 21 at an area below the positioning pin 21a is a protrusion 21b that is brought into abutment with the lead frame 3. Additionally, formed on a bottom surface of the guide plate 21 is a positioning bore 21c that is adapted to engage a positioning pin 23a of the support plate 23.

On the other hand, disposed on a side face of the guide plate 22 at an upper area thereof is the positioning bore 22a, with which the positioning pin 21a of the guide plate 21 is adapted to engage. Also, formed on the side face of the guide plate 21 at an area below the positioning bore 22a is a protrusion 22b that is brought into abutment with the lead frame 3. Additionally, formed on a bottom surface of the guide plate 22 is a positioning bore 22c that is adapted to engage a positioning pin 23b of the support plate 23.

Further, formed in a central area of the support plate 23 is a bore 23c in which the package molding jig 6 is placed. Also, disposed on an upper surface of the support plate 23 are positioning pins 23a, 23b that are adapted to engage the associated positioning bores 21c, 22c formed on the bottom wall of the guide plates 21, 22, respectively.

The package molding jig 6 is placed in the bore 23c of the support plate 23 with such a structure and the positioning pins 23a, 23b of the support plate 23 are moved to mate with the associated positioning bores 21c, 22c of the guide plates 21, 22, respectively. Additionally, the positioning pin 21a of the guide plate 21 is inserted through a bore formed in the lead frame 3 into mating engagement with the positioning bore 22a of the guide plate 22. Then, the lead frame 3 is positioned to and fixed in a given position with respect to the package molding jig 6.

EXAMPLE

The package molding jig 6, shown in FIG. 6, was manufactured from a polymethylpentene (TPX) sheet as raw material using the manufacturing apparatus shown in FIG. 7. The polymethylpentene sheet was heated to a temperature of 200° C. above a Vicat softening point of 170° C.

The TPX sheet with a thickness of 0.05 to 0.15 mm was then subjected to deep-draw forming.

The resulting package molding jig 6 had concave portions 6a each with a maximum diameter of 5.0 mm and lens portions each with a depth of 9.0 mm.

Transparent epoxy resin is filled in the package molding jig 6 to allow the lead frame 3 to be immersed therein. Subsequently, the package molding jig 6 and the lead frame 6 are left in an atmosphere for 30 minutes at a temperature of 100° C. for hardening epoxy resin. Thereafter, the lead frame 3 was subjected to post-processes such as appearance inspection, electrical tests and lead processing, upon which the lens portions were removed from the package molding jig before packaging thereby manufacturing round type LED lamps. Thus, it was successful to manufacture products with no defects such as damages to the lens portions on processes after casting.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A method of manufacturing an optical semiconductor device, comprising:
    preparing an optical semiconductor provided on a distal end of a first lead portion of a lead frame and connected electrically with a distal end of a second lead portion of the lead frame;
    forming a package molding jig having concave portions each corresponding to a contour of a package of the optical semiconductor device by deep-draw forming a thermoplastic resin sheet using a punch with a shape corresponding to the contour of the package;
    inserting the distal ends of the lead portions into the concave portion of the package molding jig for positioning and fixing; and
    filling packaging resin in the concave portion of the package molding jig.

2. The method according to claim 1, wherein the thermoplastic resin sheet is subjected to the forming after the thermoplastic resin sheet is heated to temperatures above a softening point.

3. The method according to claim 1, wherein the thermoplastic resin sheet includes a layer of a plurality of resin sheets.

4. The method according to claim 1, wherein the thermoplastic resin sheet includes resin of at least one kind selected from polymethylpentene, polyphenilene sulfide, polycarbonate, polyether sulfon, polyetherimide, polysulfon and cycloolefin polymer.

5. The method according to claim 1, further comprising the step of:
    conducting post-processes after a hardening process without removing the package molding jig from the lead frame.

6. The method according to claim 5, wherein the post-processes include steps of:
    processing the lead frame;
    conducting inspection and electrical tests; and
    conducting a taping on the lead frame.

7. The method according to claim 1, further comprising the step of:
    removing the package molding jig from the lead frame.

8. A package molding jig for an optical semiconductor device, comprising:
    a thermoplastic resin sheet formed using a punch corresponding to a contour of a package of the optical semiconductor device for thereby forming concave portions each corresponding to the contour of the package.

9. The package molding jig according to claim 8, wherein the thermoplastic resin sheet is formed after heated at temperatures above a softening point.

10. The package molding jig according to claim 8, wherein the thermoplastic resin sheet includes a layer of a plurality of resin sheets.

11. The package molding jig according to claim 8, wherein the thermoplastic resin sheet includes resin of at least one kind selected from polymethylpentene, polyphenilene sulfide, polycarbonate, polyether sulfon, polyetherimide, polysulfon and cycloolefin polymer.

12. A method of manufacturing a package molding jig of an optical semiconductor device, comprising:
    preparing a thermoplastic resin sheet; and
    forming the thermoplastic resin sheet using a punch with a shape corresponding to a contour of a package of the optical semiconductor device for thereby forming concave portions each corresponding to the contour of the package.

13. The method according to claim 12, wherein the thermoplastic resin sheet is formed after being heated at temperatures above a softening point.

14. The method according to claim 12, wherein the thermoplastic resin sheet includes a layer of a plurality of resin sheets.

15. The method according to claim 12, wherein the thermoplastic resin sheet includes resin of at least one kind selected from polymethylpentene, polyphenilene sulfide, polycarbonate, polyether sulfon, polyetherimide, polysulfon and cycloolefin polymer.

16. A manufacturing apparatus for a package molding jig of an optical semiconductor device, comprising:
    a heater heating a thermoplastic resin sheet;
    a punch having a shape corresponding to a contour of a package of the optical semiconductor device and forming concave portions each corresponding to the contour of the package in the thermoplastic resin sheet; and
    a die to which the punch is inserted while forming the thermoplastic resin sheet.

17. The manufacturing apparatus according to claim 16, wherein the thermoplastic resin sheet is formed after being heated at temperatures above a softening point.

18. The manufacturing apparatus according to claim 16, wherein the thermoplastic resin sheet includes a layer of a plurality of resin sheets.

19. The manufacturing apparatus for the package molding jig of the optical semiconductor device according to claim 16, wherein the thermoplastic resin sheet includes resin of at least one kind selected from polymethylpentene, polyphenilene sulfide, polycarbonate, polyether sulfon, polyetherimide, polysulfon and cycloolefin polymer.

* * * * *